United States Patent
Chien

(10) Patent No.: US 9,373,556 B2
(45) Date of Patent: Jun. 21, 2016

(54) MODULE IC PACKAGE STRUCTURE AND METHOD FOR MANUFACTURING THE SAME

(71) Applicant: AZUREWAVE TECHNOLOGIES, INC., New Taipei (TW)

(72) Inventor: Huang-Chan Chien, New Taipei (TW)

(73) Assignee: AZUREWAVE TECHNOLOGIES, INC., New Taipei (TW)

( * ) Notice: Subject to any disclaimer, the term of this patent is extended or adjusted under 35 U.S.C. 154(b) by 240 days.

(21) Appl. No.: 14/080,364

(22) Filed: Nov. 14, 2013

(65) Prior Publication Data
US 2015/0131230 A1  May 14, 2015

(51) Int. Cl.
*H05K 7/20* (2006.01)
*H01L 23/13* (2006.01)
*H01L 23/433* (2006.01)
*H01L 23/552* (2006.01)
*H05K 1/02* (2006.01)
*H05K 3/28* (2006.01)

(52) U.S. Cl.
CPC ............ *H01L 23/13* (2013.01); *H01L 23/4334* (2013.01); *H01L 23/552* (2013.01); *H01L 2924/14* (2013.01); *H01L 2924/15162* (2013.01); *H01L 2924/19041* (2013.01); *H01L 2924/19042* (2013.01); *H01L 2924/19043* (2013.01); *H01L 2924/19105* (2013.01); *H05K 1/0209* (2013.01); *H05K 1/0218* (2013.01); *H05K 3/284* (2013.01); *Y10T 29/49146* (2015.01)

(58) Field of Classification Search
CPC ..... H05K 1/14; H05K 1/0306; H05K 1/0201; H05K 1/0203; H05K 1/0204; H05K 1/0207; H05K 1/0209; H05K 1/0272; H05K 1/0373; H05K 1/0271; H05K 1/0206; H05K 1/0231; H01L 23/13; H01L 23/4334; H01L 23/552; Y10T 29/49146
USPC .......................................... 361/705, 717–722
See application file for complete search history.

(56) References Cited

U.S. PATENT DOCUMENTS

| | | | | |
|---|---|---|---|---|
| 6,212,074 B1* | 4/2001 | Gonsalves | .......... | H01L 23/4006 165/185 |
| 6,362,964 B1* | 3/2002 | Dubhashi | ................ | H01L 23/24 257/724 |
| 2001/0013655 A1* | 8/2001 | Smith | ................... | H01L 21/563 257/741 |
| 2004/0238934 A1* | 12/2004 | Warner | ................... | H01L 23/24 257/686 |
| 2006/0187645 A1* | 8/2006 | Numata | ............... | H05K 7/2049 361/704 |

* cited by examiner

*Primary Examiner* — Adam B Dravininkas
(74) *Attorney, Agent, or Firm* — Li & Cai Intellectual Property (USA) Office

(57) ABSTRACT

A module IC package structure for increasing heat-dissipating efficiency includes a substrate unit, an electronic unit, a package unit, a first heat-dissipating unit and a second heat-dissipating unit. The substrate unit includes a circuit substrate. The electronic unit includes a plurality of electronic components disposed on the circuit substrate and electrically connected to the circuit substrate. The package unit includes a package gel body disposed on the circuit substrate for enclosing the electronic components. The first heat-dissipating unit includes a heat-dissipating base layer disposed on the top surface of the package gel body. The second heat-dissipating unit includes a plurality of heat-dissipating auxiliary layers disposed on the top surface of the heat-dissipating base layer. Whereby, the heat-dissipating efficiency of the module IC package structure can be increased by matching the heat-dissipating base layer and the heat-dissipating auxiliary layers.

4 Claims, 7 Drawing Sheets

MODULE IC PACKAGE STRUCTURE AND METHOD FOR MANUFACTURING THE SAME

BACKGROUND OF THE INVENTION

1. Field of the Invention

The instant disclosure relates to a module IC (Integrated Circuit) package structure and a method for manufacturing thereof, and more particularly to a module IC package structure for increasing heat-dissipating efficiency and a method for manufacturing the same.

2. Description of Related Art

As integrated circuit technology has been rapidly developing, a variety of devices using the technology are developed continuously. Because the functions of the devices are rapidly added, most devices are implemented in a modular way. However, while the functions of the devices can be increased by integrating a lot of functional modules, the design of a multiple function device with small dimensions is still difficult.

In the semiconductor manufacturing process, a high level technology is used to manufacture a small chip or component. Therefore, the module manufacturer can design a functional module with small dimensions, and the device can be efficiently and fully developed.

SUMMARY OF THE INVENTION

One aspect of the instant disclosure relates to a module IC package structure for increasing heat-dissipating efficiency and a method for manufacturing the same.

One of the embodiments of the instant disclosure provides a module IC package structure for increasing heat-dissipating efficiency, comprising: a substrate unit, an electronic unit, a package unit, a first heat-dissipating unit and a second heat-dissipating unit. The substrate unit includes a circuit substrate. The electronic unit includes a plurality of electronic components disposed on the circuit substrate and electrically connected to the circuit substrate. The package unit includes a package gel body disposed on the circuit substrate for enclosing the electronic components. The first heat-dissipating unit includes a heat-dissipating base layer disposed on the top surface of the package gel body. The second heat-dissipating unit includes a plurality of heat-dissipating auxiliary layers disposed on the top surface of the heat-dissipating base layer.

Another one of the embodiments of the instant disclosure provides a module IC package structure for increasing heat-dissipating efficiency, comprising: a substrate unit, an electronic unit, a package unit, a first heat-dissipating unit and a second heat-dissipating unit. The substrate unit includes a circuit substrate. The electronic unit includes at least one first electronic component disposed on the circuit substrate and electrically connected to the circuit substrate and at least one second electronic component disposed on the circuit substrate and electrically connected to the circuit substrate, wherein heat generated by the at least one first electronic component is larger than heat generated by the at least one second electronic component. The package unit includes a package gel body disposed on the circuit substrate to enclose the at least one first electronic component and the at least one second electronic component. The first heat-dissipating unit includes a heat-dissipating base layer disposed on the top surface of the package gel body. The second heat-dissipating unit includes a plurality of first heat-dissipating auxiliary layers disposed on the top surface of the heat-dissipating base layer and a plurality of second heat-dissipating auxiliary layers disposed on the top surface of the heat-dissipating base layer, wherein the first heat-dissipating auxiliary layers are disposed above the at least one first electronic component, the second heat-dissipating auxiliary layers are disposed above the at least one second electronic component, and the total outer surface area of the first heat-dissipating auxiliary layers is larger than the total outer surface area of the second heat-dissipating auxiliary layers.

Yet another one of the embodiments of the instant disclosure provides a method for manufacturing a module IC package structure for increasing heat-dissipating efficiency, comprising: providing a circuit substrate; placing a plurality of electronic components on the circuit substrate for electrically connecting to the circuit substrate; forming a package gel body on the circuit substrate for enclosing the electronic components; forming a heat-dissipating base layer on the top surface of the package gel body; placing a pattern stencil on the top surface of the heat-dissipating base layer, wherein the pattern stencil has a plurality of through openings for exposing a unoccupied portion of the top surface of the heat-dissipating base layer; respectively filling the through openings with a plurality of heat-dissipating auxiliary layers, wherein the heat-dissipating auxiliary layers are disposed on the unoccupied portion of the top surface of the heat-dissipating base layer; and then removing the pattern stencil.

More precisely, the substrate unit includes a grounding layer disposed inside the circuit substrate and enclosed by the circuit substrate, an outer conductive structure disposed on an outer surrounding peripheral surface of the circuit substrate, and an inner conductive structure disposed inside the circuit substrate and electrically connected between the grounding layer and the outer conductive structure, wherein the outer conductive structure includes a plurality of outer conductive layers disposed on the outer surrounding peripheral surface of the circuit substrate, the inner conductive structure includes a plurality of inner conductive layers respectively corresponding to the outer conductive layers, each inner conductive layer has two opposite ends respectively contacting the grounding layer and the corresponding outer conductive layer, and the electronic components are electrically connected to the grounding layer through the circuit substrate, wherein the heat-dissipating base layer is a metal shielding layer extended from the top surface of the package gel body to the outer surrounding peripheral surface of the circuit substrate for directly contacting the outer conductive structure, and the grounding layer is electrically connected to the metal shielding layer through the inner conductive structure and the outer conductive structure in sequence.

More precisely, the substrate unit includes a grounding layer disposed inside the circuit substrate and an outer conductive structure disposed on an outer surrounding peripheral surface of the circuit substrate, wherein the outer conductive structure includes a plurality of outer conductive layers disposed on the outer surrounding peripheral surface of the circuit substrate, and the grounding layer is exposed from the outer surrounding peripheral surface of the circuit substrate for directly contacting the outer conductive layers, and the electronic components are electrically connected to the grounding layer through the circuit substrate, wherein the heat-dissipating base layer is a metal shielding layer extended from the top surface of the package gel body to the outer surrounding peripheral surface of the circuit substrate for directly contacting the outer conductive structure, and the grounding layer is electrically connected to the metal shielding layer through the outer conductive structure directly.

More precisely, the substrate unit includes a grounding layer disposed inside the circuit substrate, the grounding layer is exposed from an outer surrounding peripheral surface of the circuit substrate, and the electronic components are electrically connected to the grounding layer through the circuit substrate, wherein the heat-dissipating base layer is a metal shielding layer extended from the top surface of the package gel body to the outer surrounding peripheral surface of the circuit substrate for directly contacting the grounding layer that is exposed from the outer surrounding peripheral surface of the circuit substrate, and the electronic components are electrically connected to the metal shielding layer through the grounding layer directly.

Whereby, the heat-dissipating efficiency of the module IC package structure can be increased by matching the heat-dissipating base layer on the top surface of the package gel body and the heat-dissipating auxiliary layers on the top surface of the heat-dissipating base layer.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

First Embodiment

Figure 1:
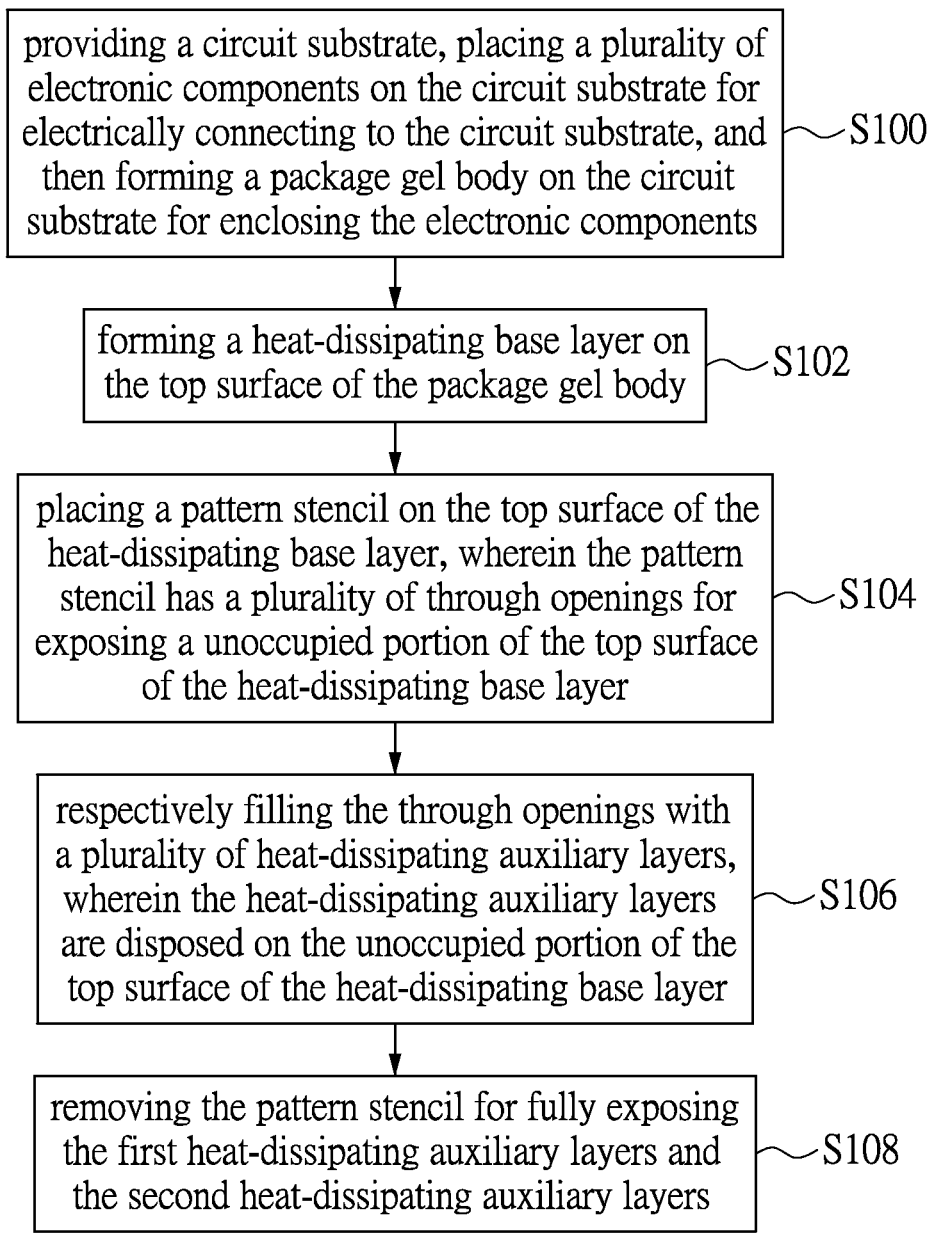
FIG. 1 shows a flowchart of the method for manufacturing a module IC package structure for increasing heat-dissipating efficiency according to the first embodiment of the instant disclosure.
Figure 2:
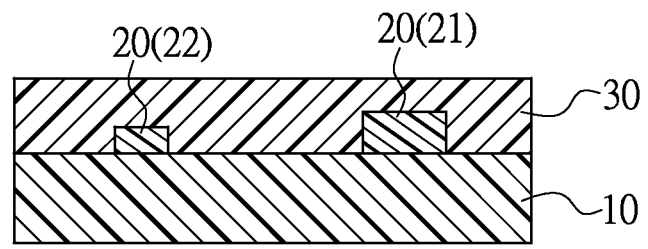
FIG. 2 shows a cross-sectional, schematic diagram of the step S100 of the method for manufacturing a module IC package structure for increasing heat-dissipating efficiency according to the first embodiment of the instant disclosure.

Referring to FIG. 1 to FIG. 6, the first embodiment of the instant disclosure provides a method for manufacturing a module IC package structure Z for increasing heat-dissipating efficiency, comprising the following steps:

First, the step S100 is that: referring to FIG. 1 and FIG. 2, providing a circuit substrate 10, placing a plurality of electronic components 20 on the circuit substrate 10 for electrically connecting to the circuit substrate 10, and then forming a package gel body 30 on the circuit substrate 10 for enclosing the electronic components 20. More precisely, the electronic components 20 can be divided into at least one first electronic component 21 and at least one second electronic component 22, and heat generated by the at least one first electronic component 21 is larger than heat generated by the at least one second electronic component 22. For example, each electronic component 20 may be may be a resistance, a capacitor, an inductance, a function chip having a predetermined function or a semiconductor chip having a predetermined function etc., but it is merely an example and is not meant to limit the instant disclosure.

Figure 3:
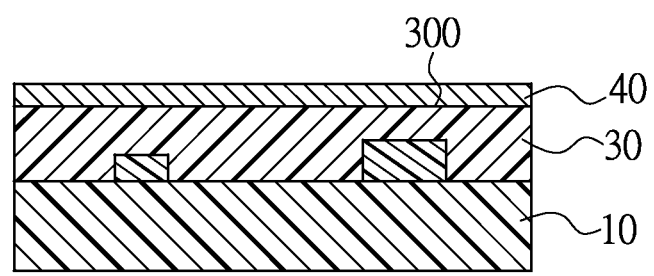
FIG. 3 shows a cross-sectional, schematic diagram of the step S102 of the method for manufacturing a module IC package structure for increasing heat-dissipating efficiency according to the first embodiment of the instant disclosure.

Next, the step S102 is that: referring to FIG. 1, FIG. 2 and FIG. 3, forming a heat-dissipating base layer 40 on the top surface 300 of the package gel body 30. For example, the heat-dissipating base layer 40 may be a metal material layer, graphene material layer or any heat-dissipating layer having high thermal conductivity, but it is merely an example and is not meant to limit the instant disclosure.

Figure 4:
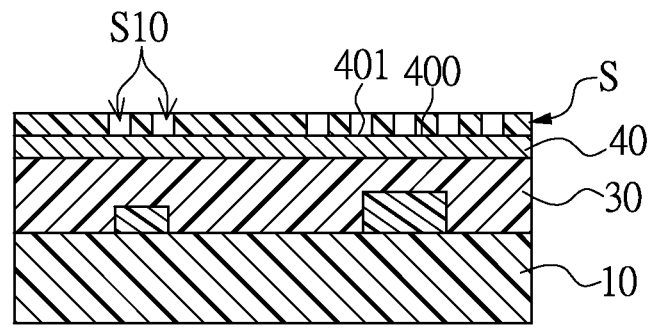
FIG. 4 shows a cross-sectional, schematic diagram of the step S104 of the method for manufacturing a module IC package structure for increasing heat-dissipating efficiency according to the first embodiment of the instant disclosure.

Then, the step S104 is that: referring to FIG. 1, FIG. 3 and FIG. 4, placing a pattern stencil S on the top surface 400 of the heat-dissipating base layer 40, wherein the pattern stencil S has a plurality of through openings S10 for exposing a unoccupied portion 401 of the top surface 400 of the heat-dissipating base layer 40. More precisely, each opening S10 may be square, trapezoid or any shape, but it is merely an example and is not meant to limit the instant disclosure.

Subsequently, the step S106 is that: referring to FIG. 1, FIG. 4 and FIG. 5, respectively filling the through openings S10 with a plurality of heat-dissipating auxiliary layers 50, wherein the heat-dissipating auxiliary layers 50 are disposed on the unoccupied portion 401 of the top surface 400 of the heat-dissipating base layer 40. More precisely, the heat-dissipating auxiliary layers 50 can be divided into a plurality of first heat-dissipating auxiliary layers 51 and a plurality of second heat-dissipating auxiliary layers 52, the first heat-dissipating auxiliary layers 51 are disposed above the at least one first electronic component 21, and the second heat-dissipating auxiliary layers 52 are disposed above the at least one second electronic component 22. For example, each heat-dissipating auxiliary layer may be a metal material layer, graphene material layer or any heat-dissipating layer having high thermal conductivity, but it is merely an example and is not meant to limit the instant disclosure.

Figure 5:
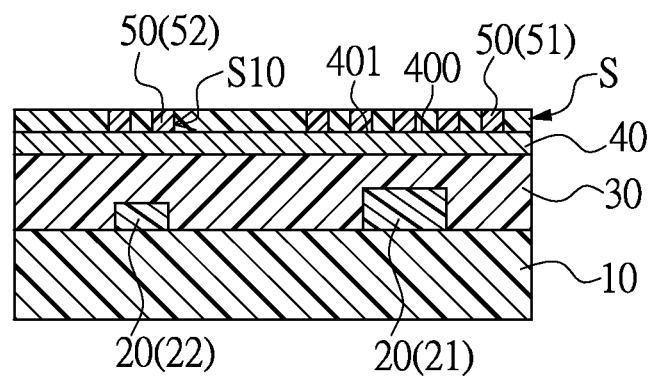
FIG. 5 shows a cross-sectional, schematic diagram of the step S106 of the method for manufacturing a module IC package structure for increasing heat-dissipating efficiency according to the first embodiment of the instant disclosure.
Figure 6:
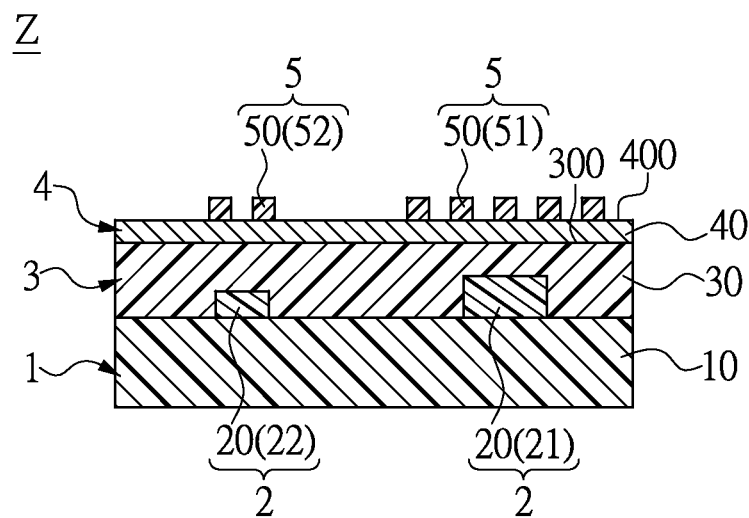
FIG. 6 shows a cross-sectional, schematic diagram of the step S108 of the method for manufacturing a module IC package structure for increasing heat-dissipating efficiency according to the first embodiment of the instant disclosure.

Finally, the step S108 is that: referring to FIG. 1, FIG. 5 and FIG. 6, removing the pattern stencil S for fully exposing the first heat-dissipating auxiliary layers 51 and the second heat-dissipating auxiliary layers 52. More precisely, the total outer surface area (or volume or size) of the first heat-dissipating auxiliary layers 51 is larger than the total outer surface area (or volume or size) of the second heat-dissipating auxiliary layers 52.

In conclusion, referring to FIG. 6, according to the above-mentioned manufacturing method, the first embodiment of the instant disclosure provides a module IC package structure Z for increasing heat-dissipating efficiency, comprising: a substrate unit 1, an electronic unit 2, a package unit 3, a first heat-dissipating unit 4 and a second heat-dissipating unit 5. The substrate unit 1 includes a circuit substrate 10. The electronic unit 2 includes a plurality of electronic components 20 disposed on the circuit substrate 10 and electrically connected to the circuit substrate 10. The package unit 3 includes a package gel body 30 disposed on the circuit substrate 10 for enclosing or covering the electronic components 20. The first heat-dissipating unit 4 includes a heat-dissipating base layer 40 disposed on the top surface 300 of the package gel body 30. The second heat-dissipating unit 5 includes a plurality of heat-dissipating auxiliary layers 50 disposed on the top surface 400 of the heat-dissipating base layer 40. Whereby, the heat-dissipating efficiency of the module IC package structure Z can be increased by matching the heat-dissipating base layer 40 on the package gel body 30 and the heat-dissipating auxiliary layers 50 on the heat-dissipating base layer 40.

More precisely, referring to FIG. 6, according to the above-mentioned manufacturing method, the first embodiment of the instant disclosure provides a module IC package structure Z for increasing heat-dissipating efficiency, comprising: a substrate unit 1, an electronic unit 2, a package unit 3, a first heat-dissipating unit 4 and a second heat-dissipating unit 5. The substrate unit 1 includes a circuit substrate 10. The electronic unit 2 includes at least one first electronic component 21 disposed on the circuit substrate 10 and electrically connected to the circuit substrate 10 and at least one second electronic component 22 disposed on the circuit substrate 10 and electrically connected to the circuit substrate 10, and heat generated by the at least one first electronic component 21 is larger than heat generated by the at least one second electronic component 22. The package unit 3 includes a package gel body 30 disposed on the circuit substrate 10 to enclose the at least one first electronic component 21 and the at least one second electronic component 22. The first heat-dissipating unit 4 includes a heat-dissipating base layer 40 disposed on the top surface 300 of the package gel body 30. The second heat-dissipating unit 5 includes a plurality of first heat-dissipating auxiliary layers 51 disposed on the top surface 400 of the heat-dissipating base layer 40 and a plurality of second heat-dissipating auxiliary layers 52 disposed on the top surface 400 of the heat-dissipating base layer 40. The first heat-dissipating auxiliary layers 51 are disposed above the at least one first electronic component 21, the second heat-dissipating auxiliary layers 52 are disposed above the at least one second electronic component 22, and the total outer surface area of the first heat-dissipating auxiliary layers 51 is larger than the total outer surface area of the second heat-dissipating auxiliary layers 52.

Figure 7:
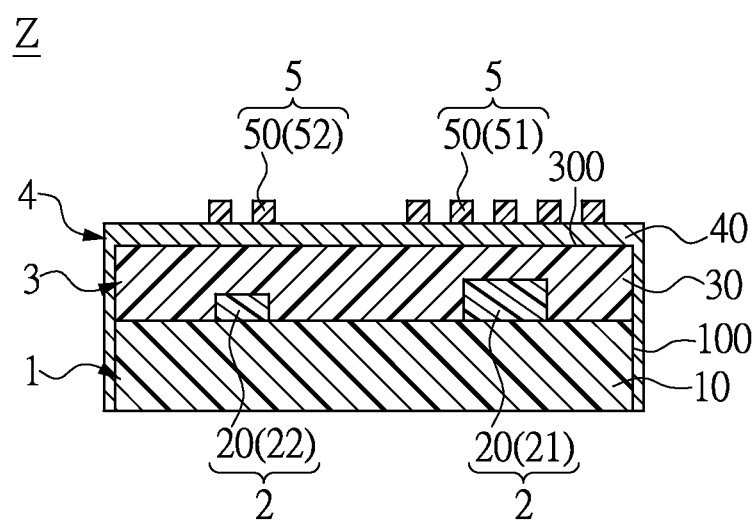
FIG. 7 shows a cross-sectional, schematic diagram of the heat-dissipating base layer extended to the outer surrounding peripheral surface of the circuit substrate according to the first embodiment of the instant disclosure.

It's worth mentioning that: referring to FIG. 7, the heat-dissipating base layer 40 may be a metal shielding layer extended from the top surface 300 of the package gel body 30 to an outer surrounding peripheral surface 100 of the circuit substrate 10, thus the heat-dissipating base layer 40 can provide an electrical shielding effect for the module IC package structure Z. In other words, the instant disclosure not only can increase the heat-dissipating efficiency of the module IC package structure Z, but also can generate the electrical shielding effect for the module IC package structure Z.

Second Embodiment

Figure 8:
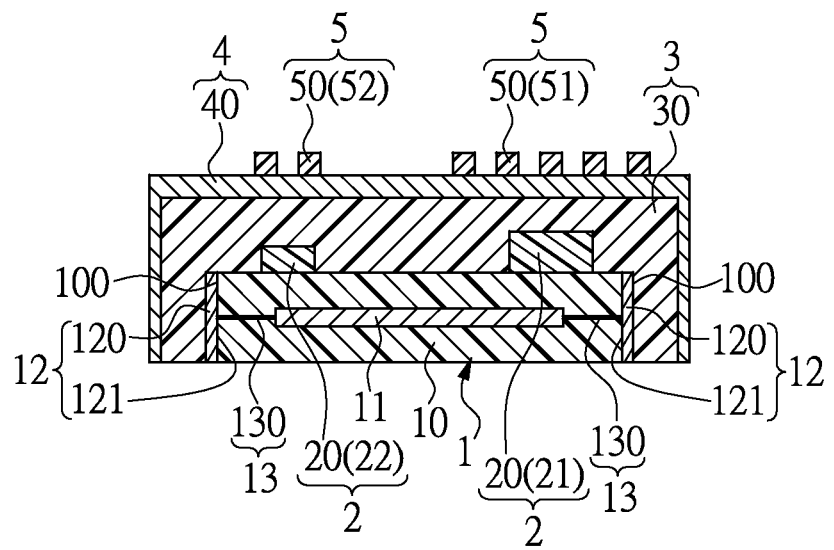
FIG. 8 shows a cross-sectional, schematic diagram of the module IC package structure for increasing heat-dissipating efficiency according to the second embodiment of the instant disclosure.
Figure 9:
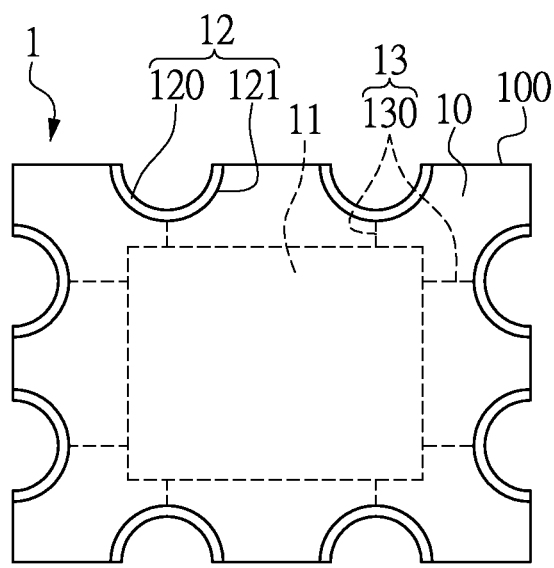
FIG. 9 shows a top, schematic diagram of the substrate unit according to the second embodiment of the instant disclosure.

Referring to FIG. 8 and FIG. 9, the second embodiment of the instant disclosure provides a module IC package structure Z for increasing heat-dissipating efficiency, comprising: a substrate unit 1, an electronic unit 2, a package unit 3, a first heat-dissipating unit 4 and a second heat-dissipating unit 5. Comparing FIG. 8 with FIG. 7, the difference between the second embodiment and the first embodiment is as follows:

First, in the second embodiment, the substrate unit 1 includes a grounding layer 11 disposed inside the circuit substrate 10 and enclosed by the circuit substrate 10, an outer conductive structure 12 disposed on an outer surrounding peripheral surface 100 of the circuit substrate 10, and an inner conductive structure 13 disposed inside the circuit substrate 10 and electrically connected between the grounding layer 11 and the outer conductive structure 12. The outer conductive structure 12 includes a plurality of outer conductive layers 120 disposed on the outer surrounding peripheral surface 100 of the circuit substrate 10, the outer conductive structure 12 includes a plurality of half through holes 121 disposed on the outer surrounding peripheral surface 100 of the circuit substrate 10 and passing through the circuit substrate 10, and the outer conductive layers 120 are respectively disposed on inner surfaces of the half through holes 121. In addition, the inner conductive structure 13 includes a plurality of inner conductive layers 130 respectively corresponding to the outer conductive layers 120, and each inner conductive layer 130 has two opposite ends respectively contacting the grounding layer 11 and the corresponding outer conductive layer 120.

Then, in the second embodiment, the electronic components 20 are electrically connected to the grounding layer 11 through the circuit substrate 10. For example, the circuit substrate 10 as a multilayer circuit board structure includes at least one conductive structure disposed inside the circuit substrate 10 and electrically connected between the electronic component 20 and the grounding layer 11, thus the electronic components 20 of each electronic unit 2 can be electrically connected to the corresponding grounding layer 11 through the corresponding circuit substrate 10. Moreover, the heat-dissipating base layer 40 may be a metal shielding layer extended from the top surface 300 of the package gel body 30 to the outer surrounding peripheral surface 100 of the circuit substrate 10 for directly contacting the outer conductive structure 12, and the grounding layer 11 is electrically connected to the metal shielding layer through the inner conductive structure 13 and the outer conductive structure 12 in sequence.

Third Embodiment

Figure 10:
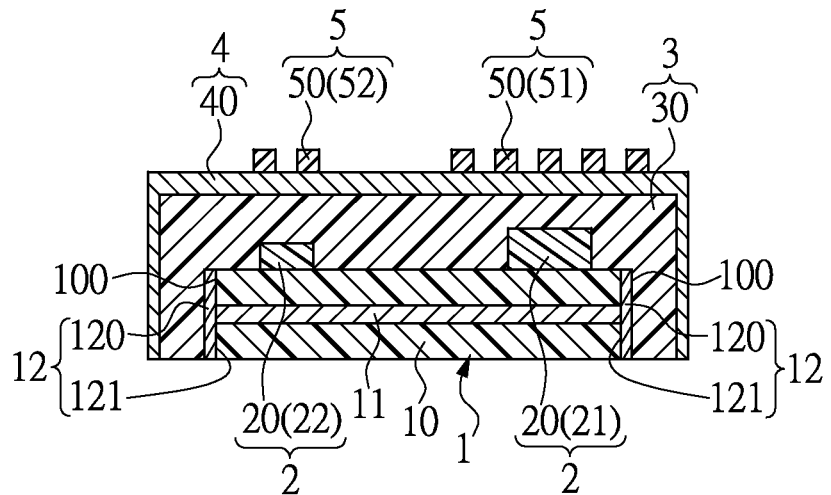
FIG. 10 shows a cross-sectional, schematic diagram of the module IC package structure for increasing heat-dissipating efficiency according to the third embodiment of the instant disclosure.

Referring to FIG. 10, the third embodiment of the instant disclosure provides a module IC package structure Z for increasing heat-dissipating efficiency, comprising: a substrate unit 1, an electronic unit 2, a package unit 3, a first heat-dissipating unit 4 and a second heat-dissipating unit 5. Comparing FIG. 10 with FIG. 8, the difference between the third embodiment and the second embodiment is as follows: in the third embodiment, the substrate unit 1 includes a grounding layer 11 disposed inside the circuit substrate 10 and an outer conductive structure 12 disposed on an outer surrounding peripheral surface 100 of the circuit substrate 10. In addition, the outer conductive structure 12 includes a plurality of outer conductive layers 120 disposed on the outer surrounding peripheral surface 100 of the circuit substrate 10. The grounding layer 11 is exposed from the outer surrounding peripheral surface 100 of the circuit substrate 10 for directly contacting the outer conductive layers 120, and the electronic components 20 are electrically connected to the grounding layer 11 through the circuit substrate 10. Furthermore, the heat-dissipating base layer 40 may be a metal shielding layer extended from the top surface 300 of the package gel body 30 to the outer surrounding peripheral surface 100 of the circuit substrate 10 for directly contacting the outer conductive structure 12, and the grounding layer 11 is electrically connected to the metal shielding layer through the outer conductive layers 120 of the outer conductive structure 12 directly.

Fourth Embodiment

Figure 11:
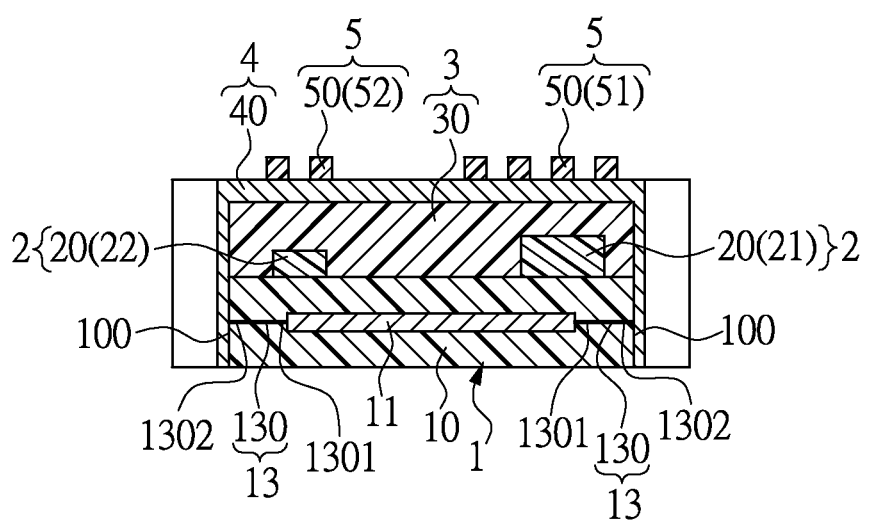
FIG. 11 shows a cross-sectional, schematic diagram of the module IC package structure for increasing heat-dissipating efficiency according to the fourth embodiment of the instant disclosure.
Figure 12:
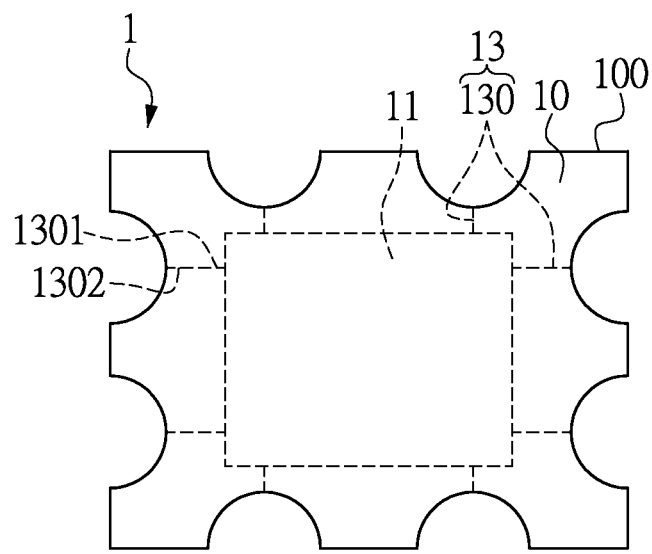
FIG. 12 shows a top, schematic diagram of the substrate unit according to the fourth embodiment of the instant disclosure.

Referring to FIG. 11 and FIG. 12, the fourth embodiment of the instant disclosure provides a module IC package structure Z for increasing heat-dissipating efficiency, comprising: a substrate unit 1, an electronic unit 2, a package unit 3, a first heat-dissipating unit 4 and a second heat-dissipating unit 5. Comparing FIG. 11 with FIG. 7, the difference between the fourth embodiment and the first embodiment is as follows: in the fourth embodiment, the substrate unit 1 includes a grounding layer 11 disposed inside the circuit substrate 10 and enclosed by the circuit substrate 10 and an inner conductive structure 13 disposed inside the circuit substrate 10 and electrically connected to the grounding layer 11. In addition, the inner conductive structure 13 includes a plurality of inner conductive layers 130, and each inner conductive layer 130 has a first end 1301 directly contacting the grounding layer 11 and a second end 1302 opposite to the first end 1301 and exposed from an outer surrounding peripheral surface 100 of the circuit substrate 10, and the electronic components 20 are electrically connected to the grounding layer 11 through the circuit substrate 10 having a multilayer circuit board structure inside the circuit substrate 10. Furthermore, the heat-dissipating base layer 40 may be a metal shielding layer extended from the top surface 300 of the package gel body 30 to the outer surrounding peripheral surface 100 of the circuit substrate 10 for directly contacting the second end 1302 of each inner conductive layer 130, and the grounding layer 11 is electrically connected to the metal shielding layer through the inner conductive layers 130 of the inner conductive structure 13.

Fifth Embodiment

Figure 13:
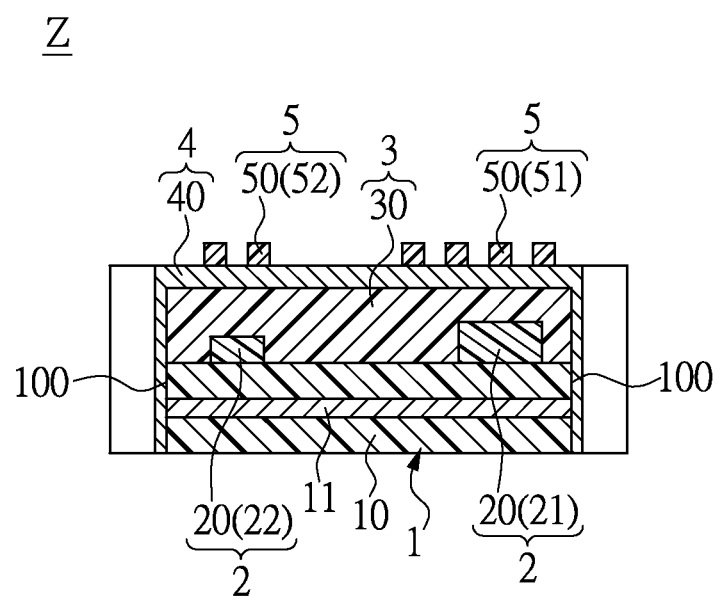
FIG. 13 shows a cross-sectional, schematic diagram of the module IC package structure for increasing heat-dissipating efficiency according to the fifth embodiment of the instant disclosure.

Referring to FIG. 13, the fifth embodiment of the instant disclosure provides a module IC package structure Z for increasing heat-dissipating efficiency, comprising: a substrate unit 1, an electronic unit 2, a package unit 3, a first heat-dissipating unit 4 and a second heat-dissipating unit 5. Comparing FIG. 13 with FIG. 11, the difference between the fifth embodiment and the fourth embodiment is as follows: in the fifth embodiment, the substrate unit 1 includes a grounding layer 11 disposed inside the circuit substrate 10, the grounding layer 11 is exposed from an outer surrounding peripheral surface 100 of the circuit substrate 10, and the electronic components 20 are electrically connected to the grounding layer 11 through the circuit substrate 10. In addition, the heat-dissipating base layer 40 may be a metal shielding layer extended from the top surface 300 of the package gel body 30 to the outer surrounding peripheral surface 100 of the circuit substrate 10 for directly contacting the grounding layer 11 that is exposed from the outer surrounding peripheral surface 100 of the circuit substrate 10, and the electronic components 20 are electrically connected to the metal shielding layer through the grounding layer 11 directly.

In conclusion, the heat-dissipating efficiency of the module IC package structure Z can be increased by matching the heat-dissipating base layer 40 on the top surface 300 of the package gel body 30 and the heat-dissipating auxiliary layers 50 on the top surface 400 of the heat-dissipating base layer 40.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A module IC package structure for increasing heat-dissipating efficiency, comprising:
   a substrate unit including a circuit substrate;
   an electronic unit including a plurality of electronic components disposed on the circuit substrate and electrically connected to the circuit substrate;
   a package unit including a package gel body disposed on the circuit substrate for enclosing the electronic components;
   a first heat-dissipating unit including a heat-dissipating base layer disposed on the top surface of the package gel body; and
   a second heat-dissipating unit including a plurality of heat-dissipating auxiliary layers disposed on the top surface of the heat-dissipating base layer;
   wherein the substrate unit includes a grounding layer disposed inside the circuit substrate and enclosed by the circuit substrate and an inner conductive structure disposed inside the circuit substrate and electrically connected to the grounding layer, wherein the inner conductive structure includes a plurality of inner conductive layers, and each inner conductive layer has a first end directly contacting the grounding layer and a second end opposite to the first end and exposed from an outer surrounding peripheral surface of the circuit substrate, and the electronic components are electrically connected to the grounding layer through the circuit substrate.

2. The module IC package structure of claim 1, wherein the heat-dissipating base layer and the heat-dissipating auxiliary layers are metal material layers or graphene material layers, and the heat-dissipating base layer is a metal shielding layer extended from the top surface of the package gel body to the outer surrounding peripheral surface of the circuit substrate.

3. The module IC package structure of claim 1, wherein the heat-dissipating base layer is a metal shielding layer extended from the top surface of the package gel body to the outer surrounding peripheral surface of the circuit substrate for directly contacting the second end of each inner conductive layer, and the grounding layer is electrically connected to the metal shielding layer through the inner conductive structure.

4. A module IC package structure for increasing heat-dissipating efficiency, comprising:
   a substrate unit including a circuit substrate;
   an electronic unit including at least one first electronic component disposed on the circuit substrate and electrically connected to the circuit substrate and at least one second electronic component disposed on the circuit substrate and electrically connected to the circuit substrate, wherein heat generated by the at least one first electronic component is larger than heat generated by the at least one second electronic component;
a package unit including a package gel body disposed on the circuit substrate to enclose the at least one first electronic component and the at least one second electronic component;
a first heat-dissipating unit including a heat-dissipating base layer disposed on the top surface of the package gel body; and
a second heat-dissipating unit including a plurality of first heat-dissipating auxiliary layers disposed on the top surface of the heat-dissipating base layer and a plurality of second heat-dissipating auxiliary layers disposed on the top surface of the heat-dissipating base layer, wherein the first heat-dissipating auxiliary layers are disposed above the at least one first electronic component, the second heat-dissipating auxiliary layers are disposed above the at least one second electronic component, and the total outer surface area of the first heat-dissipating auxiliary layers is larger than the total outer surface area of the second heat-dissipating auxiliary layers;
wherein the substrate unit includes a grounding layer disposed inside the circuit substrate and enclosed by the circuit substrate and an inner conductive structure disposed inside the circuit substrate and electrically connected to the grounding layer, wherein the inner conductive structure includes a plurality of inner conductive layers, and each inner conductive layer has a first end directly contacting the grounding layer and a second end opposite to the first end and exposed from an outer surrounding peripheral surface of the circuit substrate, and the at least one first electronic component and the at least one second electronic component are electrically connected to the grounding layer through the circuit substrate.

* * * * *